(12) United States Patent
Kim et al.

(10) Patent No.: US 9,841,833 B2
(45) Date of Patent: Dec. 12, 2017

(54) TOUCH SENSOR INTEGRATED DISPLAY DEVICE

(71) Applicant: LG Display Co., Ltd., Seoul (KR)

(72) Inventors: Minsu Kim, Seoul (KR); Myeonsik Lee, Paju-si (KR); Hajin Yoo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/788,631

(22) Filed: Jun. 30, 2015

(65) Prior Publication Data

US 2017/0003786 A1    Jan. 5, 2017

(51) Int. Cl.
| | |
|---|---|
| *G06F 3/041* | (2006.01) |
| *G06F 3/044* | (2006.01) |
| *G02F 1/1333* | (2006.01) |
| *G02F 1/1362* | (2006.01) |
| *H01L 29/786* | (2006.01) |
| *G02F 1/1345* | (2006.01) |
| *G02F 1/1343* | (2006.01) |

(52) U.S. Cl.
CPC ........ *G06F 3/0412* (2013.01); *G02F 1/13338* (2013.01); *G02F 1/136286* (2013.01); *G06F 3/044* (2013.01); *G06F 3/0416* (2013.01); *G02F 1/13454* (2013.01); *G02F 1/136227* (2013.01); *G02F 2001/13629* (2013.01); *G02F 2001/133357* (2013.01); *G02F 2001/134372* (2013.01); *H01L 29/78636* (2013.01)

(58) Field of Classification Search
CPC ............. H01L 27/1214; H01L 27/1248; H01L 27/0688; H01L 29/78636; G02F 1/13454; G02F 1/136286; G02F 2001/13629; G02F 1/136227; G02F 1/133345; G09G 2300/0408; G09G 2300/0426; G06F 3/0412; G06F 3/044
See application file for complete search history.

(56) References Cited

U.S. PATENT DOCUMENTS

| | | | | |
|---|---|---|---|---|
| 6,037,635 | A * | 3/2000 | Yamazaki | H01L 27/0688 257/351 |
| 9,046,955 | B1 * | 6/2015 | Lee | G06F 3/0412 |
| 9,377,913 | B2 * | 6/2016 | Kim | G06F 3/0412 |
| 2001/0052950 | A1 * | 12/2001 | Yamazaki | H01L 27/1214 349/43 |
| 2003/0232459 | A1 * | 12/2003 | Yasukawa | H01L 29/06 438/57 |
| 2004/0042707 | A1 * | 3/2004 | Imai | G02B 6/43 385/14 |
| 2007/0296658 | A1 * | 12/2007 | Kim | G09G 3/3648 345/87 |

(Continued)

*Primary Examiner* — Sanjiv D Patel
(74) *Attorney, Agent, or Firm* — Fenwick & West LLP (57) ABSTRACT

A touch sensor integrated display device includes a plurality of common electrode blocks that defines a plurality of touch driving channels and a plurality of touch sensing channels. The touch driving channel is formed of a group of common electrode blocks electrically linked via a touch signal line placed under the layer of the common electrode blocks. The source/drain of the circuit TFTs provided in the non-display area is formed of the same metal layer of the touch signal line. The source/drain of the pixel TFTs provided in the display area is formed of a metal layer different from the metal layer of the touch signal line.

20 Claims, 7 Drawing Sheets

(56) References Cited

U.S. PATENT DOCUMENTS

| | | | | |
|---|---|---|---|---|
| 2009/0101895 A1* | 4/2009 | Kawamura | ......... | H01L 27/1225 257/43 |
| 2010/0194697 A1* | 8/2010 | Hotelling | .............. | G06F 3/0412 345/173 |
| 2011/0081769 A1* | 4/2011 | Takemura | ........... | H01L 27/1214 438/463 |
| 2012/0274603 A1* | 11/2012 | Kim | ...................... | G06F 3/0412 345/174 |
| 2014/0118277 A1* | 5/2014 | Kim | ........................ | G06F 3/044 345/173 |
| 2015/0378223 A1* | 12/2015 | Wen | .................... | H01L 27/0288 349/40 |
| 2016/0026289 A1* | 1/2016 | Liu | ......................... | G06F 3/044 345/174 |
| 2016/0246416 A1* | 8/2016 | Xie | ....................... | G06F 3/0412 |

* cited by examiner

TOUCH SENSOR INTEGRATED DISPLAY DEVICE

BACKGROUND OF THE INVENTION

Field of the Invention

The present disclosure generally relates to a display device, and more particularly to a display device configured for advanced mutual capacitance touch sensing.

Description of the Related Art

Touch screens have been one of the most popular user input mechanism in a variety of electronic devices because of their ease and versatility of operation. Such a touch screen allows to identify the occurrence and position of a user's touches on the screen, enabling the electronic device to respond appropriately. Conventionally, touch screen display includes a touch panel overlaid on the front of a flat panel displays such as liquid crystal displays (LCDs) or organic light emitting diode (OLED) displays. Such a touch panel is provided with touch driving lines and sensing lines arranged in rows and columns on a substantially transparent substrate. Touch input is recognized by change in capacitance when an object, such as a user's finger, touches the touch panel.

However, overlaying such a separate capacitive touch sensor panel can add thickness and weight to the display device. For this reason, attempts have been made to implement touch sensor within the display panel. As a result, some of the components in the display panel have been configured to implement a touch sensor. However, using components used in displaying images on the display panel to also function as a part of touch sensor has its downsides. For instance, configurations adopted for implementing touch sensor within the display panel can increase undesired parasitic capacitance, which can lead to unsatisfactory display quality. This is especially true for in-plane-switching (IPS) mode and fringe-field-switching (FFS) mode LCD devices, in which the pixel electrode and the common electrode for controlling the orientation of the liquid crystal molecules are provided on the same side of the liquid crystal layer.

Accordingly, there is a need for a display device with improved configuration for sensing touch inputs on display devices.

SUMMARY OF THE INVENTION

The present disclosure relates to configurations of components within a display panel for implementing a touch sensor. To implement a touch sensor within a display panel, some conductive lines and/or electrodes in the display panel, which are used for operating the pixels, can be configured for sensing touch inputs at certain times.

In an embodiment, a display device includes a plurality of pixels provided in a display area of a display panel. Each of the pixels includes a pixel thin film transistor (TFT) connected to a pixel electrode. The display device includes a common electrode, which is segmented into a plurality of common electrode blocks. The plurality of common electrode blocks are configured to provide a plurality of touch driving channels and a plurality of touch sensing channels in the display device. Each of the touch driving channels is defined with a group of selective common electrode blocks electrically linked to each other via a touch signal line. The display device further includes one or more circuit thin film transistors provided in a non-display area of a display panel. The source/drain layer, the pixel TFT and source/drain layer of the circuit TFT are formed of a different metal layer.

In some embodiments, the source/drain layer of the pixel TFT is provided on a first planarization layer whereas the source/drain layer of the circuit TFT is provided under the first planarization layer.

In some embodiments, a second planarization layer may be provided on the source/drain layer of the pixel TFT. The layer of the pixel electrode and the layer of common electrode blocks are provided on the second planarization layer.

In some embodiments, the source/drain layer of the circuit TFT may be formed of the same metal layer as the touch signal line.

The improved configuration reduces the undesired capacitance coupling between the data line and the gate of the TFT, and also reduces cross talk to provide improve the touch sensing accuracy in the display device.

It is to be understood that both the foregoing general description and the following detailed description of the present invention are exemplary and explanatory and are intended to provide further explanation of the invention as claimed.

DETAILED DESCRIPTION

Reference will now be made in detail to the exemplary embodiments of the present invention, examples of which are illustrated in the accompanying drawings. Wherever possible, the same reference numbers will be used throughout the drawings to refer to the same or like parts.

The following description includes embodiments described in the context of LCDs, in particular an In-Plane-Switching (IPS) mode LCD and/or a Fringe-Field-Switching (FFS) mode LCD, in which the touch driving blocks and common electrode blocks (e.g., common electrodes) are formed on a lower substrate together with pixel electrodes.

Example embodiments may be described herein with reference to a Cartesian coordinate system in which the x-direction and the y-direction can be equated to the horizontal direction and the vertical direction, respectively. However, one skilled in the art will understand that reference to a particular coordinate system is simply for the purpose of clarity, and does not limit the direction of the structures to a particular direction or a particular coordinate system.

It should be noted that the term "line" is sometimes used herein to simply refer a conductive pathway, as one skilled in the art will readily understand, and is not limited to structures that are strictly linear, but includes conductive pathways of various different shapes, sizes, materials, etc.

Although specific materials and types of materials may be included in the descriptions of example embodiments, one skilled in the art will understand that other materials that achieve the same function can be used. For example, it should be understood that a "conductive layer" as described in the examples below can be a layer and a stack of layers formed of any electrically conductive material such as a metal, a carbon based material, a composite conductive material and the like.

Figure 1:
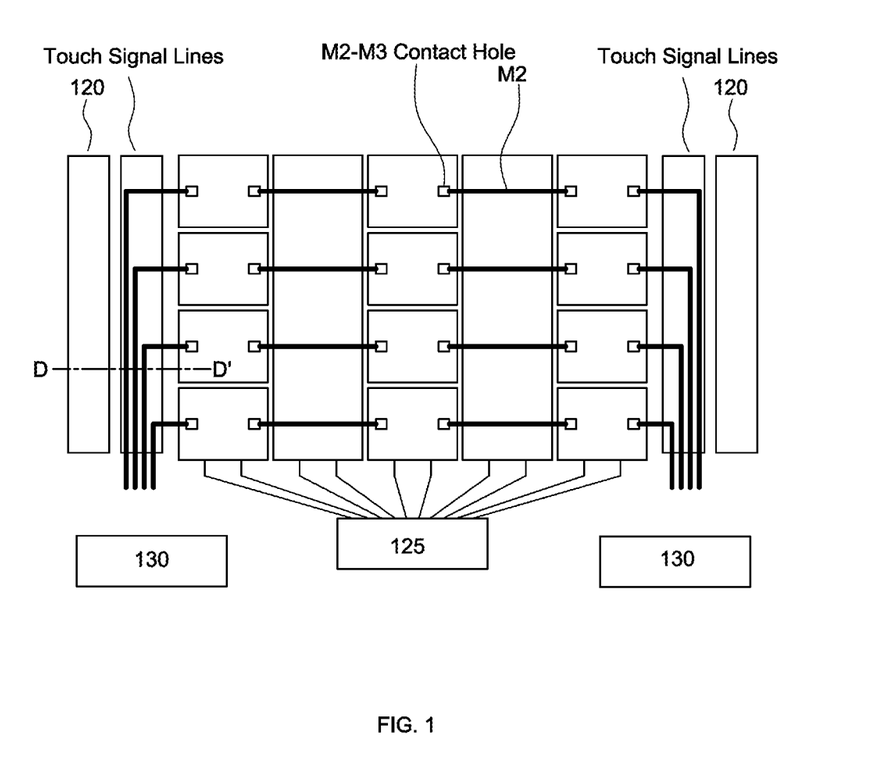
FIG. 1 is a schematic illustration of an exemplary touch sensor integrated display device according to an embodiment of the disclosure.

FIG. 1 illustrates an exemplary configuration of a display panel with an integrated touch sensor according to embodiments of the present disclosure. Referring to FIG. 1, a touch sensor integrated display device 100 includes a display panel, a gate driver 120, a data driver 125 and a touch driver 130.

The gate driver 120 provides scan signals on the gate lines and the data driver 125 provides data signals on the data lines. The touch driver 130 generates the touch driving signal, which is provided on the touch driving channels. In some embodiments, the touch driver 130 may be provided on a separate circuit, which may be connected to the display panel through a flexible printed circuit board (FPCB). Also, in some other embodiments, the touch driver 130 and the data driver 125 may be provided on the same FPCB. In some embodiments, the touch driver 130 can be provided as a part of the data driver 125. For instance, a data drive integrated circuit (Data D-IC) chip may include the touch driver 130.

The gate driver 120 can be provided as a separate circuit and attached to the panel through FPCB. Also, the gate driver 120 can be provided as a gate drive integrated circuit (Gate D-IC), and may be attached directly on the display panel. Further, the gate driver 120 can be implemented with a plurality of thin-film-transistors (TFTs) on the display panel.

In operating the pixels of the display panel, a common electrode and a pixel electrode are applied with a common voltage and a pixel voltage, respectively, to create electric field across the display panel to control the liquid crystal molecules. The touch sensor of the display device 100 can be based on mutual capacitance. A mutual capacitance based touch sensor includes a plurality of touch driving channels (i.e., TX channels) and a plurality of touch sensing channels (i.e., RX channels) that are arranged in a matrix pattern. For example, touch driving channels can be formed in rows while touch sensing channels can be formed in columns (e.g., orthogonal). The RX channels extend across the TX channels.

To implement a touch sensor in the display panel, the common electrode used in operating the pixels is segmented into a plurality of common electrode blocks. Each TX channel is defined by electrically connecting a plurality of common electrode blocks arranged in one direction. Each RX channel can be formed of a common electrode block or defined by a group of common electrode blocks arranged in an orthogonal direction to the arrangement of the common electrode blocks forming the TX channel. The number of TX channel and the RX channel in the display panel may depend on the desired resolution of touch sensitivity.

In operation, The TX channel is electrically connected to a voltage source touch drive signal source and the touch sensing channel is connected to the touch driver 130. During a touch sensing operation, a touch driving signal (e.g., AC waveform) is applied to a group of common electrode blocks that form a TX channel. Providing the touch driving signal on the TX channel capacitive coupling at the intersections of the TX channel and the RX channel.

A touch input made on the display panel changes the capacitive coupling at the intersection of the touch driving channel and the touch sensing channel, and it changes the current that is carried by the touch sensing channel. This information in a raw or in some processed form can be used to determine the locations of touch inputs on the display panel. The touch driver 130 performs this operation for each intersection of the TX and RX channels at rapid rate so as to provide multipoint sensing.

In the example shown in FIG. 1, each of the TX channel was defined by a group of common electrode blocks arranged in a row direction (X-Axis), and each of the RX channel was defined by a single common electrode block having a rectangular shape extending in a column direction (Y-Axis). However, the arrangement of the common electrode blocks for the TX channel and the RX channel is not limited as such, and may vary depending on the desired layout of the TX and RX channels in the display panel. While all of the common electrode blocks arranged in a single row across the display panel forms a single TX channel, it should be noted that the number of common electrode blocks forming a single TX channel can vary according to the touch scanning frequency and the touch scanning resolution of the display panel. For instance, multiple TX channels can be defined in a single row by the respective number of groups of common electrode blocks 112.

In FIG. 1, an RX channel defined by a single common electrode block extending orthogonal to the TX channels. However, in some embodiments, each RX channel can be defined by a plurality of common electrodes blocks arranged in a column direction. Further, a plurality of common electrodes arranged in a column direction may define more than one RX channels in a single column.

In order to improve the touch sensing capability and accuracy at the edge of the panel, the common electrode blocks at the farthest ends of the two side edges of the active area (i.e., left and right ends) may be may be configured as the RX channels. This way, touch inputs made by the object with very small touch point (e.g., 2.5Φ) can be recognized at the edges of the display panel.

To further improve the performance of the touch sensing capability, the width of the common electrode blocks forming the RX channels at the edges may be different from the width of other common electrode blocks in the other areas of the display panel.

To improve the touch sensing accuracy at the upper and lower edges of the display panel, the common electrode blocks at the upper and lower edges of the display panel can have a reduced height in comparison to the other common electrode blocks at other areas of the display panel. This way, narrower TX channels can be provided at the top and bottom edges of the display panel. The number of TX and RX channels in the display panel can be adjusted according to the arrangement and the sizes (i.e., width and height) of the common electrode blocks in in the active area.

As shown in FIG.1, the touch driving signals can be provided from the touch driver 130 to the TX channels and via conductive lines routed in the non-display area of the display panel. Each conductive line from the touch driver 130 can be routed in the non-display areas and connected to a common electrode block in a group of common electrode blocks forming a TX channel. Similarly, signals from the RX channels are provided to the touch driver 130 via conductive lines routed in the non-display area of the display panel.

The connection between a group of common electrode blocks forming the TX channel is made by a touch signal line, which is extending in horizontal direction (i.e., X-direction) underneath the layer of the common electrode blocks. Each of the common electrode blocks of the TX channel is connected to the touch signal line via one or more contact holes through a number of insulation layers between the layer of common electrode blocks and the touch signal line. The touch signal line bypasses the common electrode block of the RX channel. In this way, horizontally arranged TX channels and vertically arranged RX channels can be provided in the same layer.

Figure 2A:
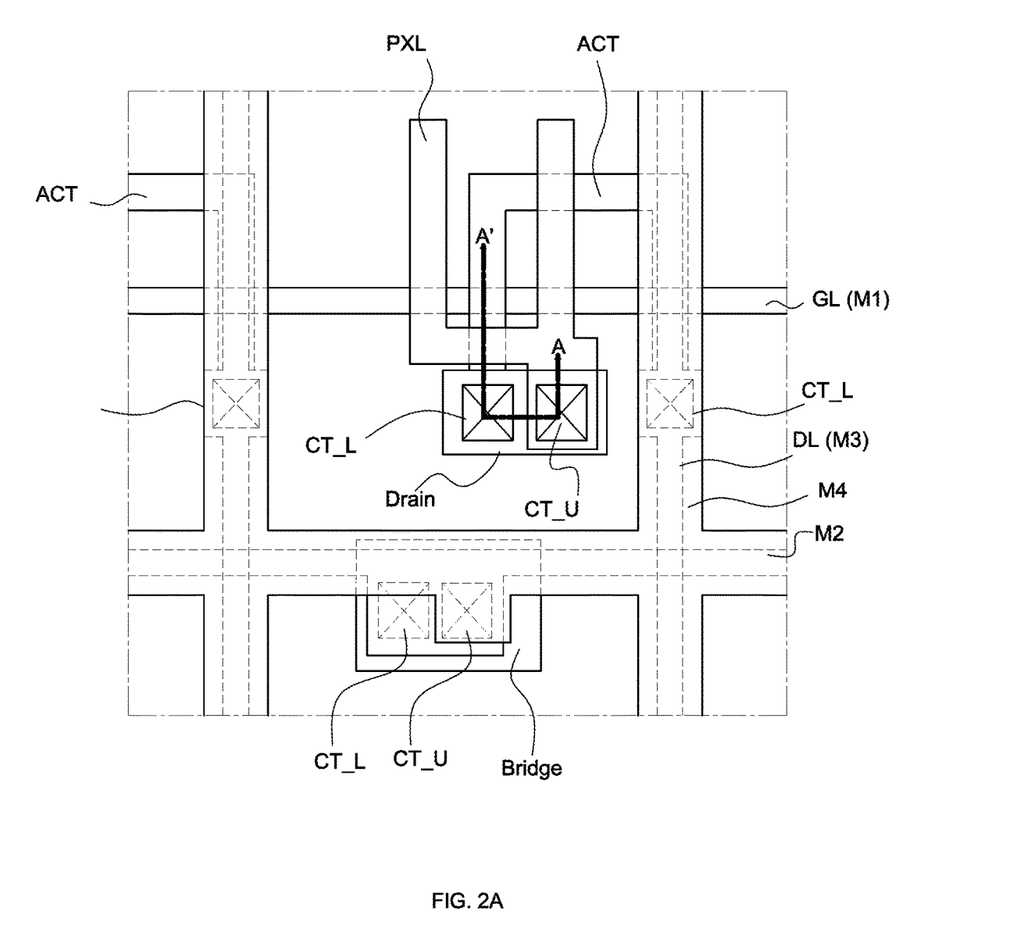
FIG. 2A is an enlarged planar view showing an exemplary configuration of the display panel.
Figure 2B:
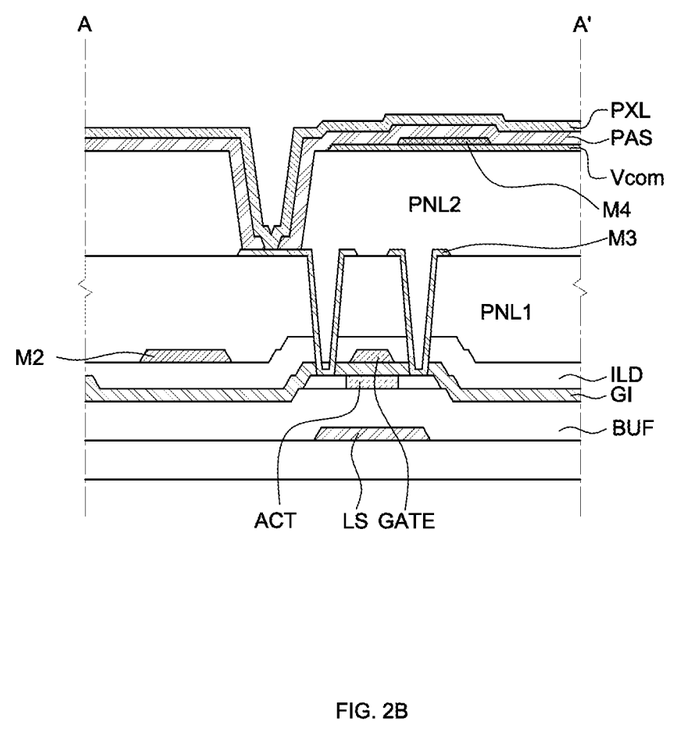
FIG. 2B is a cross-sectional views taken along the line A-A' depicted in FIG. 2A.
Figure 2C:
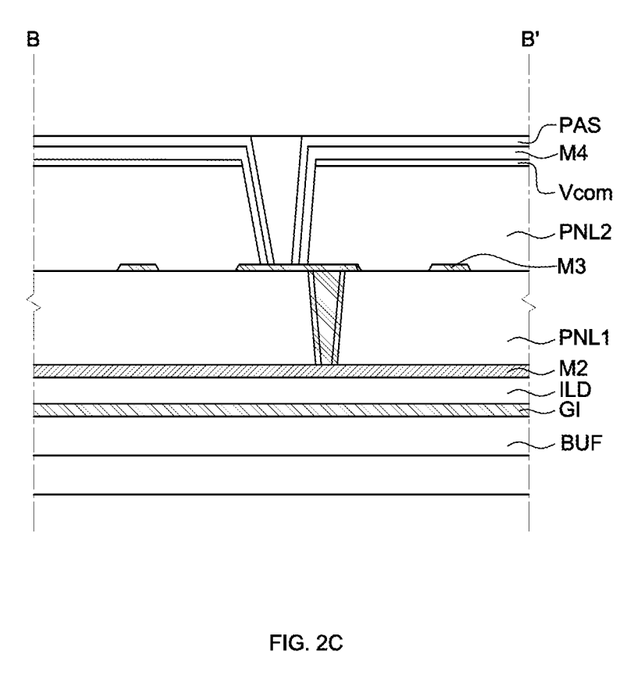
FIG. 2C is a cross-section view of the display panel taken along the line B-B' depicted in FIG. 2A.

FIG. 2A is an enlarged planar view showing an exemplary configuration of the display panel. FIG. 2B is a cross-sectional views taken along the line A-A' depicted in FIG. 2A. FIG. 2C is a cross-section view of the display panel taken along the line B-B' depicted in FIG. 2A.

Referring to FIGS. 2A-2C, a pixel is defined at the intersection of a gate line GL and a data line DL. The pixel includes a thin film transistor (TFT). The gate of the TFT is connected to the gate line GL, and the source of the TFT is connected to the data line DL. The drain of the TFT is connected to the pixel electrode PXL.

The gate is provided on the semiconductor layer ACT of the TFT, and they are insulated from each other by the gate insulation layer GI. In the present disclosure, the metal layer of the gate (and the gate line GL) may be referred to as the first metal layer M1. The interlayer dielectric layer ILD and the first planarization layer PLN1 are provided over the gate of the TFT. The metal layer of the source and drain of the TFT is provided on the first planarization layer PLN1, and is in contact with the source region and the drain region of the semiconductor layer via the lower contact holes CT_L through the first planarization layer PLN1 and the interlayer dielectric layer ILD. Placing the source/drain metal of the pixel TFT above the first planarization layer PLN1 reduces the undesired capacitance coupling between the data line DL and the gate of the TFT and reduces cross talk to provide improve the touch sensing accuracy in the display panel.

It should be noted that a second planarization layer PLN2 is provided over the source/drain metal of the TFT in the pixel region, and the common electrode VCOM and the pixel electrode PXL are provided on the second planarization layer PLN2. A passivation layer PAS is provided in between the layer of the common electrode VCOM and the layer of pixel electrode PXL to insulate one from another. Accordingly, the pixel electrode PXL is in contact with the drain of the TFT via the upper contact hole CT_U formed through the second planarization layer PLN2 and the passivation layer PAS, and the drain is in contact with the drain region of the semiconductor layer ACT via the lower contact hole CT_L formed through the first planarization layer PLN1.

The common electrode VCOM and the pixel electrode PXL are formed of transparent conductive material, such as indium-tin-oxide (ITO) and the like, so that the light emitted from the backlight unit can pass through them. To provide extra conductive pathways throughout the common electrode block, a low resistance metal layer may be provided on the common electrode VCOM. The low resistance metal layer on the common electrode VCOM may be patterned to maintain the aperture ratio of the pixel. For instance, the low resistance metal layer can be provided in a grid pattern within a common electrode block. The vertical lines of the grid pattern may be provided on the data lines DL such that at least some part of the vertical line and the data line DL overlap each other. Also, the horizontal lines of the grid pattern may be provided on the touch signal lines such that at least some part of the horizontal line of the grid and the touch signal line overlap one another.

The touch signal line is placed under the first planarization layer PLN1 but placed above the gate metal layer. In other words, the touch signal line is formed of a metal layer that is different from the gate metal layer and the source/drain metal layer of the TFT in the pixel region. Accordingly, in the present disclosure, the gate metal layer may be referred to as the first metal layer M1, the metal layer of the touch signal line may be referred to as the second metal layer M2, the source/drain metal layer of the pixel TFT may be referred to as the third metal layer M3, and the low resistance metal layer on the layer of the common electrode blocks may be referred to as the fourth metal layer M4 of the display panel.

As shown in FIGS. 2A and 2C, the third metal layer M3 can be patterned to provide a bridge on first planarization layer PLN1. The bridge may be in contact with the touch signal line via the contact hole CT_L in the first planarization layer PLN1. Also, the bridge may be in contact with the common electrode block or the low resistance conductive line (i.e., horizontal line of the grid) via the contact hole CT_U through the second planarization layer PLN2.

It is preferred that the touch signal lines are provided uniformly throughout the display panel to maintain the display uniformity in operating the pixels. For instance, a touch signal line may be arranged between every two immediately adjacent pixels in vertical direction. In some cases, a touch signal line may be provided under each of the horizontal lines of the grid patterned fourth metal layer M4. Accordingly, several touch signal lines may be arranged to extend under a common electrode block, and each of the common electrode blocks forming the TX channels in the display panel can be connected to multiple touch signal lines by the configurations described above. Instead of placing the touch signal lines, dummy lines may be used to maintain the display uniformity in the display panel. A light shield LS may be provided underneath the semiconductor layer ACT of the pixel TFT. A buffer layer BUF may be interposed between the gate insulation layer GI and the light shield LS.

Figure 3A:
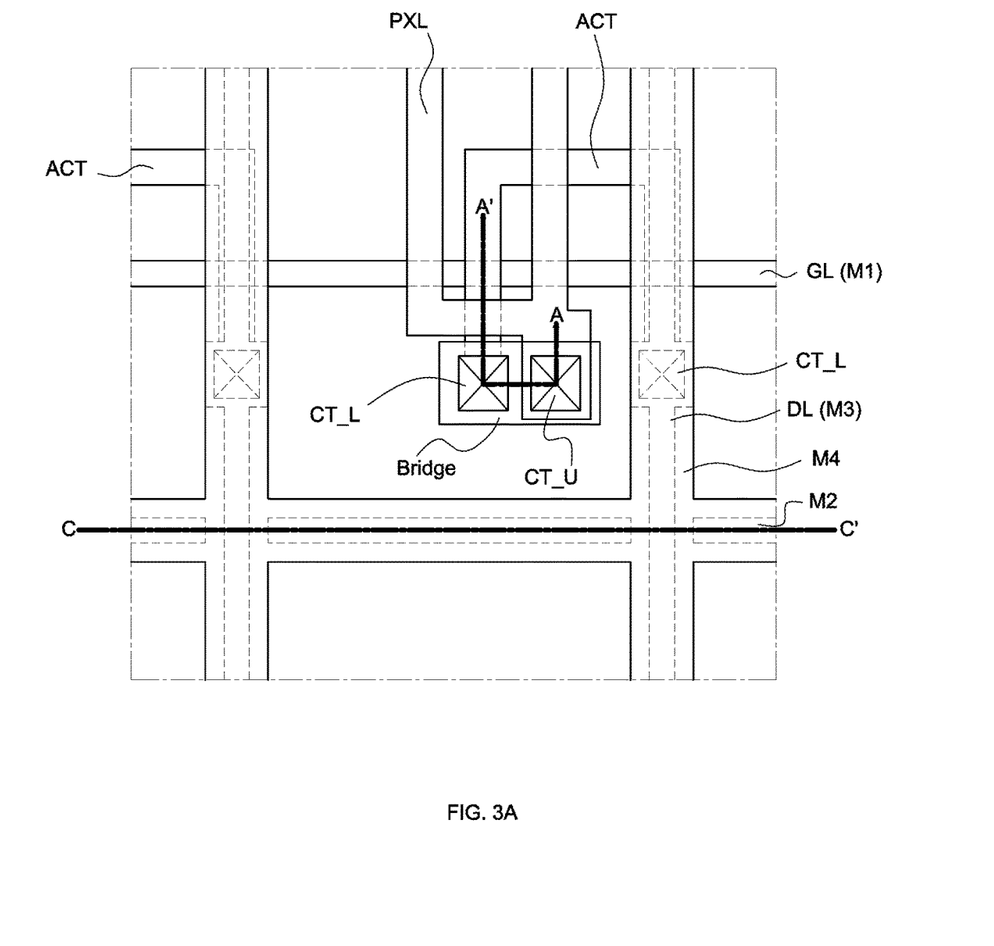
FIG. 3A is an enlarged planar view showing an exemplary configuration of the display panel in the region where a dummy touch signal line is placed.
Figure 3B:
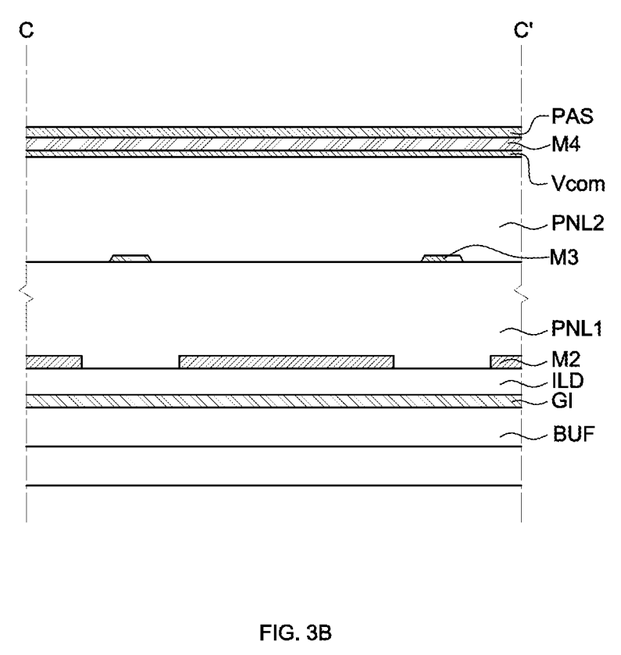
FIG. 3B is a cross-sectional view taken along the line C-C' depicted in FIG. 3A.

FIG. 3A is an enlarged planar view showing an exemplary configuration of the display panel in the region where a dummy touch signal line is placed. FIG. 3B is a cross-sectional view taken along the line C-C' depicted in FIG. 3A.

Referring to the FIGS. 3A and 3B, the arrangement of the gate line GL, the data line DL, the TFT and the grid patterned fourth metal layer M4 may be the same as described in reference to the FIGS. 2A-2C. In the region depicted in FIGS. 3A and 3B, however, a dummy line is provided in place of the touch signal line. The dummy line and the touch signal line are both formed of the second metal layer M2 placed under the first planarization layer PLN1. However, the dummy line may be provided as multiple floating conductive line pieces. Since the common electrode block need not be connected to the dummy line, the bridge metal between the first planarization layer PLN1 and the second planarization layer PLN2 may not be provided in this region as depicted in FIGS. 3A and 3B.

Figure 4:
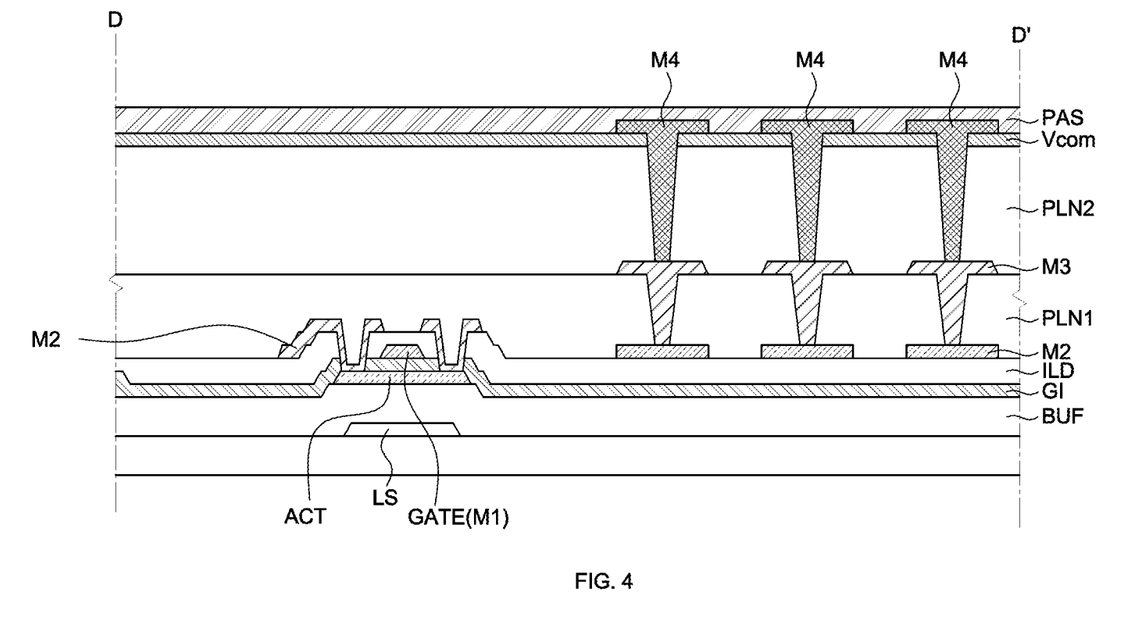
FIG. 4 is a cross-sectional view of the display panel taken along the line D-D' depicted in FIG. 1, illustrating an exemplary configuration of the touch signal lines routed in the non-display area of the display panel.

FIG. 4 is a cross-sectional view of the display panel taken along the line D-D' depicted in FIG. 1, illustrating an exemplary configuration of the touch signal lines routed in the non-display area of the display panel.

Referring to FIG. 4, a set of conductive lines formed of the third metal layer M3 (i.e., source/drain metal layer of the pixel TFT) is provided on the first planarization layer PLN1, and each conductive line of the set is in contact with a touch signal line through a contact hole CT_L in the first planarization layer PLN1. Another set of conductive lines formed of the fourth metal layer M4 (i.e., grid patterned low resistance metal layer in the pixel region) is provided on the second planarization layer PLN2, and each conductive line of the second set is in contact with a conductive line provided by the third metal layer M3. By connecting the touch signal line with extra conductive lines placed thereon, low electrical resistance conductive pathways can be provided between the touch driver 130 and the common electrode blocks of the TX channel.

As mentioned above, the gate driver of the display device can be implemented with a plurality of TFTs placed in the non-display area. In FIG. 4, only a single TFT is shown for simplicity. Unlike the pixel TFT described above, the TFT for implementing the gate driver or other circuits in the non-display area of the display panel has its source and drain formed in the second metal layer M2, which is the same metal layer as the touch signal line. Placing the entire TFT under the first planarization layer PLN1 may be more advantageous in terms of protecting the TFT from the heat and moistures.

It will be apparent to those skilled in the art that various modifications and variations can be made in the present invention without departing from the scope of the inventions. Thus, it is intended that the present invention covers the modifications and variations of this invention provided they come within the scope of the appended claims and their equivalents.

What is claimed is:

1. A display device, comprising:
    a plurality of pixels provided in a display area of a display panel, each of the plurality of pixels having a pixel thin film transistor (TFT) connected to a pixel electrode, the pixel TFT comprising a gate, a source, a drain, a portion of a dielectric layer on top of the gate, a source electrode in a metal layer on a first planarization layer on the dielectric layer, and a drain electrode in the metal layer, the source electrode of the pixel TFT connected to the source through the dielectric layer and the first planarization layer, the drain electrode of the pixel TFT connected to the drain through the first planarization layer and the dielectric layer;
    a touch signal line extending across at least a subset of the plurality of pixels on the dielectric layer but below the first planarization layer;
    a plurality of common electrode blocks that provides a plurality of touch driving channels and a plurality of touch sensing channels, each of the touch driving channels defined by a subset of the plurality of common electrode blocks electrically linked via a touch signal line; and
    one or more circuit thin film transistors provided in a non-display area of a display panel, a source electrode and a drain electrode of the one or more circuit thin film transistors (TFTs) are formed at least in another metal layer below the first planarization layer.

2. The display device of claim 1, further comprising a second planarization layer covering the source electrode and the drain electrode of the pixel TFT formed at least in the metal layer on the first planarization layer.

3. The display device of claim 2, wherein the source and drain of the circuit TFT are formed of the same metal layer as the touch signal line.

4. The display device of claim 3, further comprising a grid patterned conductive line placed on an upper surface of each of the plurality of common electrode blocks.

5. The display device of claim 4, further comprising a bridge interposed between the first planarization layer and the second planarization layer, wherein the touch signal line is in contact with the bridge through a contact hole in the first planarization layer and the grid patterned conductive line on the common electrode block is in contact with the bridge through a contact hole in the second planarization layer.

6. The display device of claim 4, wherein a vertical line of the grid patterned conductive line is arranged on a data line such that at least some part of the vertical line of the grid patterned conductive line and the data line overlaps one another.

7. The display device of claim 4, wherein a horizontal line of the grid patterned conductive line is arranged on the touch signal line such that at least some part of the horizontal line of the grid patterned conductive line and the data line overlaps one another.

8. The display device of claim 1, wherein the touch signal line for linking the subset of common electrode blocks for defining the touch driving channel is arranged to bypass the touch sensing channels.

9. The display device of claim 1, wherein at least two touch driving channels are defined with the common electrode blocks arranged in a single row.

10. The display device of claim 1, wherein the plurality of common electrode blocks are between pixel electrodes and the first planarization layer.

11. The display device of claim 1, further comprising a data line formed on the metal layer above the first planarization layer and below a second planarization layer.

12. The display device of claim 1, further comprising a dummy line formed in the same metal layer as the touch signal line.

13. The display device of claim 1, wherein the touch signal line is formed on the dielectric layer, and the first planarization layer is formed on the signal line and the dielectric layer.

14. The display device of claim 1, wherein the touch signal line does not contact a gate insulator extending between a gate of the pixel TFT and a semiconductor layer of the pixel TFT.

15. A display device comprising:
    an array of pixels in a display area of a display panel, each pixel connected to a pixel thin film transistor (TFT) having a gate, a source, a drain, a portion of a dielectric layer on top of the gate, a source electrode in a first metal layer on a first planarization layer that is on the dielectric layer, and a drain electrode in the first metal layer; and
    a set of common electrode blocks that provide multiple touch driving channels and multiple touch sensing channels to support touch operations and functions applied to the display area of the display panel, each touch driving channel defined by a subset of the common electrode blocks connected via a touch signal line, which extends across at least a subset of the pixels, on the dielectric layer but below the first planarization layer.

16. The display device of claim 15, further comprising:
    at least one circuit thin film transistor (TFT) in a non-display area of the display panel, the circuit TFT having a source electrode and a drain electrode in a second metal layer below the first planarization layer.

17. The display device of claim 16, further comprising:
    a second planarization layer covering the source electrode and the drain electrode of the pixel TFT formed at least in the first metal layer on the first planarization layer.

18. The display device of claim 17, further comprising:
a data line in the first metal layer above the planarization layer and below the second planarization layer.

19. The display device of claim 18, wherein the touch signal line that links the subset of common electrode blocks to define the touch driving channel is arranged to bypass the touch sensing channels, and at least two driving channels are defined with the common electrode blocks arranged in a single row.

20. The display device of claim 19, further comprising:
a grid patterned conductive line on an upper surface of each of the plurality of common electrode block; and
a bridge interposed between the first planarization layer and the second planarization layer, wherein the touch signal line is in contact with the bridge through a contact hole in the first planarization layer and the grid patterned conductive line on the common electrode block is in contact with the bridge through a contact hole in the second planarization layer,
wherein a vertical line of the grid patterned conductive line is arranged on the data line such that at least some part of the vertical line of the grid patterned conductive line and the data line overlaps one another, and
wherein a horizontal line of the grid patterned conductive line is arranged on the touch signal line such that at least some part of the horizontal line of the grid patterned conductive line and a data line overlaps one another.

* * * * *